(12) United States Patent
Yamaguchi

(10) Patent No.: US 6,198,160 B1
(45) Date of Patent: *Mar. 6, 2001

(54) SURFACE MOUNTED TYPE SEMICONDUCTOR DEVICE WITH WRAP-AROUND EXTERNAL LEADS

(75) Inventor: Tadashi Yamaguchi, Tokyo (JP)

(73) Assignee: Oki Electric Industry Co., Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/955,817

(22) Filed: Oct. 22, 1997

(30) Foreign Application Priority Data

Feb. 12, 1997 (JP) .................................... 9-27424

(51) Int. Cl.⁷ ................................................ H01L 23/495
(52) U.S. Cl. .................... 257/676; 257/673; 257/680; 257/686; 257/696; 257/730; 257/773
(58) Field of Search ...................... 257/666, 692, 257/696, 686, 700, 730, 734, 753, 773, 776, 783, 680, 684, 659, 676, 673; 438/106

(56) References Cited

U.S. PATENT DOCUMENTS

| | | | |
|---|---|---|---|
| 3,930,115 | * 12/1975 | Uden et al. | 257/692 |
| 4,147,889 | * 4/1979 | Andrews et al. | 257/668 |
| 4,155,615 | * 5/1979 | Zimmerman, Jr. et al. | 257/696 |
| 4,398,235 | * 8/1983 | Lutz et al. | 257/686 |
| 4,673,967 | * 6/1987 | Hingorany | 257/696 |
| 4,996,587 | 2/1991 | Hinrichmeyer et al. | 257/676 |
| 5,053,852 | * 10/1991 | Biswas et al. | 257/696 |
| 5,157,475 | * 10/1992 | Yamaguchi | 257/784 |
| 5,200,364 | * 4/1993 | Loh | 257/696 |
| 5,293,068 | * 3/1994 | Kohno et al. | 257/676 |
| 5,347,159 | 9/1994 | Khandros et al. | 257/692 |
| 5,349,501 | * 9/1994 | Kawakami | 257/692 |
| 5,350,947 | 9/1994 | Takekawa et al. | 257/702 |
| 5,359,224 | * 10/1994 | Heinen et al. | 257/696 |
| 5,375,041 | * 12/1994 | McMahon | 257/734 |
| 5,466,888 | * 11/1995 | Beng et al. | 257/692 |
| 5,583,375 | 12/1996 | Tsubosaki et al. | 257/692 |
| 5,594,275 | * 1/1997 | Kwon et al. | 257/686 |
| 5,600,179 | * 2/1997 | Suzuki | 257/696 |
| 5,639,990 | * 6/1997 | Nishihara et al. | 257/730 |
| 5,674,785 | * 10/1997 | Akram et al. | 438/106 |
| 5,708,293 | * 1/1998 | Ochi et al. | 257/666 |
| 5,714,405 | * 2/1998 | Tsubosaki et al. | 438/106 |
| 5,747,874 | * 5/1998 | Seki et al. | 257/686 |
| 5,763,829 | * 6/1998 | Tomita et al. | 257/666 |
| 5,783,857 | * 7/1998 | Ziegner et al. | 257/700 |
| 5,801,439 | * 9/1998 | Fujisawa et al. | 257/686 |

FOREIGN PATENT DOCUMENTS

| | | |
|---|---|---|
| 94 17 734 | 3/1995 | (DE) . |
| 6-14219A1 | 9/1994 | (EP) . |
| 8-125066 | 5/1996 | (JP) . |

* cited by examiner

*Primary Examiner*—Olik Chaudhuri
*Assistant Examiner*—Alonzo Chambliss
(74) *Attorney, Agent, or Firm*—Rabin & Champagne, P.C.

(57) ABSTRACT

A semiconductor device of surface-mount type includes a circuit strip tailored to have patterns projected, a semiconductor element fixedly joined to the circuit strip, and pads on the semiconductor element electrically connected by wires to the corresponding patterns on the circuit strip and sealed with a resin material. While the surface-mount type semiconductor device is adapted to be simple in structure and capable of high-density mounting, an appliance on which the semiconductor device is mounted and a method of producing the semiconductor device are also provided.

29 Claims, 13 Drawing Sheets

FIG.1 (c)  FIG.1(c)'
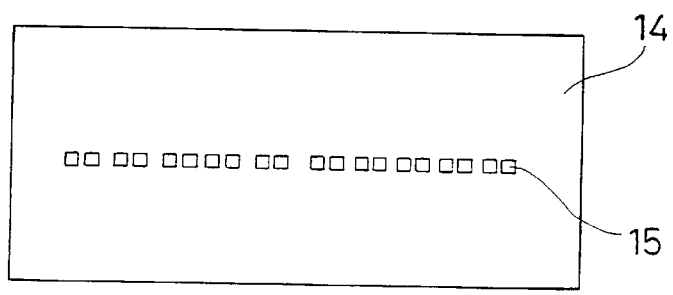
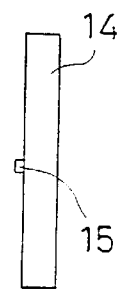
FIG.1 (d)  FIG.1(d)'
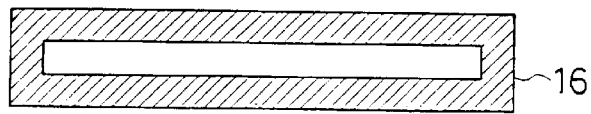
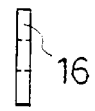

FIG.5 (a)
FIG.5(a)'
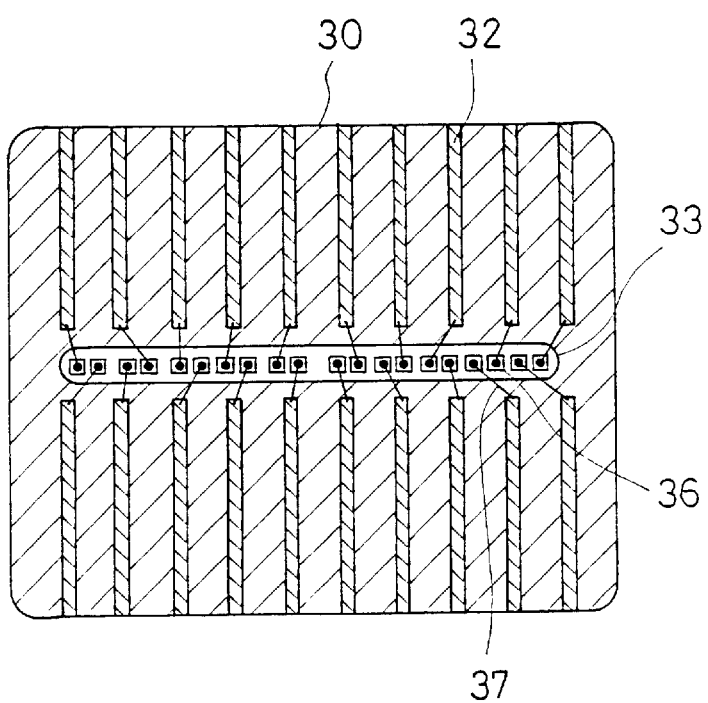
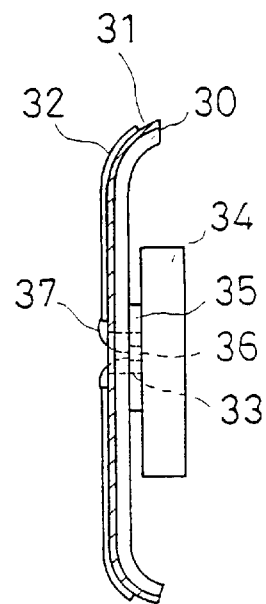

Prior Art

SURFACE MOUNTED TYPE SEMICONDUCTOR DEVICE WITH WRAP-AROUND EXTERNAL LEADS

BACKGROUND OF THE INVENTION

The present invention relates to a semiconductor device, an appliance on which the semiconductor device is mounted, and a method of producing the semiconductor device.

The demand for minimizing the size or thickness of semiconductor devices, including semiconductor integrated circuit chips, has sharply increased, particularly in IC packaging. A chip scale package technique (CSP) is known for producing IC packages, namely semiconductor packaged IC chips for use as memories, which are reduced to a size almost equal to the size of an IC element. One such CSP technique is disclosed in Japanese Patent Laid-open Publication No. H8-125066.

FIG. 8 is a cross-sectional view of a conventional chip scale package, in which a semiconductor element 1 has pads 2 mounted on a center region of the lower side thereof. A connector lead frame 4 is located and bonded by an electrically insulating adhesive 3 to the lower side of the semiconductor element 1. The connector lead frame 4 is connected by wires 5 to the pads 2 of the semiconductor element 1. The connector lead frame 4 has projections formed by e.g. etching. The entire assembly is sealed with a resin material 6, except for the projections of the lead frame 4, which must be exposed. The exposed projections of the connector lead frame 4 are coated with doses of solder paste which serve as external electrodes 7. The chip scale package is now completed.

However, such a conventional semiconductor device has some disadvantages. For example, forming of the connector lead frame by etching is an intricate task which is difficult to implement by a common pressing technique such as stamping as would serve to bring costs down. Also, sealing with resin is difficult since a particular region has to be exposed. This leads to deficiencies in technical quality.

SUMMARY OF THE INVENTION

The present invention is directed towards overcoming the above disadvantages attributed to conventional technology, and its primary object is to provide a novel, improved semiconductor device of surface-mount type which is simple in structure and capable of high-density mounting, to provide an appliance on which the semiconductor device is mounted, and to provide a method of producing the semiconductor device.

It is another object of the present invention to provide a novel, improved semiconductor device of surface-mount type in which patterns are formed on a circuit strip by a printed circuit board technique, thus to have a circuitry arrangement of higher accuracy and elaborateness and contributing to the ability to provide high-density mounting, an appliance on which the semiconductor device is mounted, and a method of producing the semiconductor device.

It is a further object of the present invention to provide a novel, improved semiconductor device of surface-mount type in which a circuit strip is equipped with ribs which serve as barriers to prevent overflow of a fluid resin material, thus permitting the procedure to be minimized and avoiding deflection of a region of the circuit strip provided for bonding to a semiconductor element, thereby to give a higher bonding strength, and also to provide an appliance on which the semiconductor device is mounted and a method of producing the semiconductor device.

It is a still further object of the present invention to provide a novel, improved semiconductor device of surface-mount type, an appliance on which the semiconductor device is mounted, and a method of producing the semiconductor device, wherein the semiconductor element is wrapped with both side ends of a circuit strip, thus increasing the mechanical strength even after mounted on a circuit board and ensuring a higher reliability, and in addition, with the circuit strip that wraps around the semiconductor element being made of a metallic material, obtaining a shielding effect, thus improving the electrical characteristics.

It is a still further object of the present invention to provide a novel, improved semiconductor device of surface-mount type which is matched to reflow conditions required for mounting on a circuit board and allows patterns on a circuit strip to be used for inspecting the electrical conduction after completed or mounted, an appliance on which the semiconductor device is mounted, and a method of producing the semiconductor device.

It is a still further object of the present invention to provide a novel, improved semiconductor device of surface-mount type which is tailored for providing a "towering arrangement," that is an arrangement in which two or more devices are mounted one over the other, thus permitting their processing capability to be optimized without increasing the mounting area on a circuit board, an appliance on which the semiconductor devices are mounted, and a method of producing the semiconductor devices.

For achievement of these objects, a semiconductor device or a method of producing the same embodying a first feature of the present invention is characterized by a circuit strip tailored to have its patterns projected, a semiconductor element fixedly joined to the circuit strip, and pads on the semiconductor element electrically connected by respective wires to the corresponding patterns on the circuit strip and sealed with a resin material.

A semiconductor device mounted appliance embodying a second feature of the present invention is designed in which the semiconductor device of the first feature is mounted on a circuit board.

A semiconductor device embodying a third feature of the present invention is characterized by a semiconductor element having electrodes provided on one side thereof, a circuit strip having conductive patterns provided on one side thereof, the other side of which being bonded to the semiconductor element, for corresponding to the electrodes which are exposed, wires respectively electrically joining between the electrodes and the conductive patterns, and a sealing material sealing the electrodes and the wires.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

In the drawings:

FIGS. 5(a) to 5(c)' illustrate a second part of the procedure for producing the semiconductor device of the third embodiment;

PREFERRED EMBODIMENTS OF THE INVENTION

Preferred embodiments of the present invention in the form of a semiconductor device, an apparatus for mounting the semiconductor on a circuit board, and a method of producing the semiconductor device, will be described in more detail referring to the accompanying drawings.

First Embodiment

A procedure for producing the semiconductor device of a first embodiment of the present invention will be described referring to FIGS. 1(a) to 1(d)' and FIGS. 2(a) to 2(d)'.

Figure 1:
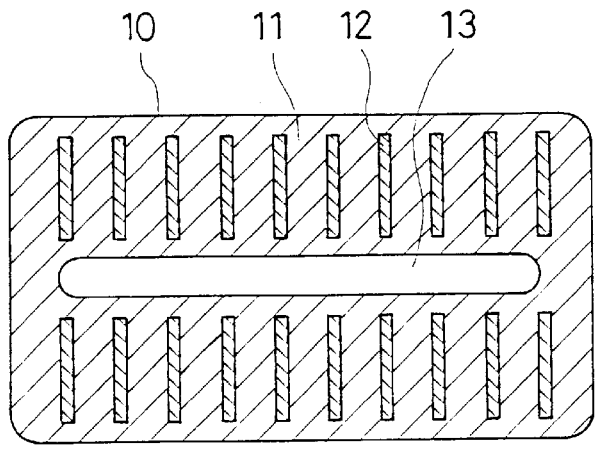
FIGS. 1(a) to 1(d)' illustrate a first part of a procedure for producing a semiconductor device of a first embodiment according to the present invention.
Figure 1A:
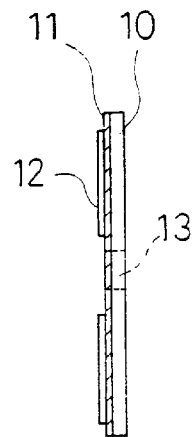

(1) The procedure starts with preparing a circuit strip 10 made of, e.g. a metal, which has an insulating layer 11 and an array of patterns 12 formed on one side thereof, as best shown in the plan view of FIG. 1(a) and the side view of FIG. 1(a)'. The circuit strip 10 has a through opening 13 provided in a center region thereof.

Figure 1B:
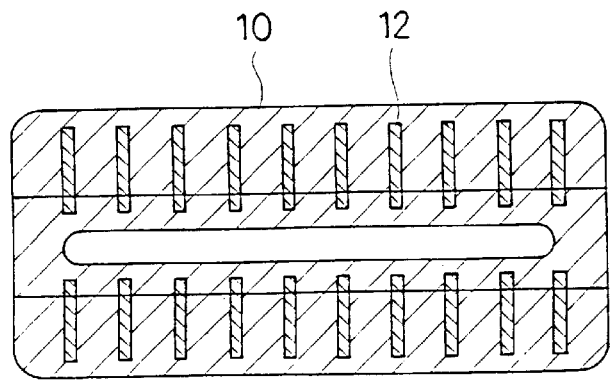
Figure 1B:
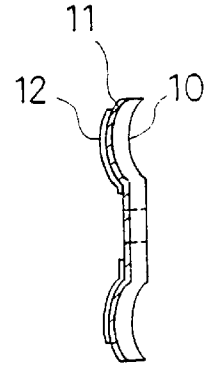

(2) The circuit strip 10 is tailored by pressing or other means to have the patterns 12 arcuately projected as shown in the plan view of FIG. 1(b) and the side view of FIG. 1(b)'.

(3) A semiconductor element 14 is prepared before being mounted to the circuit strip 10, as shown in the plan view of FIG. 1(c) and the side view of FIG. 1(c)'. The semiconductor element 14 has a row of pads 15 for bonding provided on a center region thereof.

(4) An amount of adhesive, or more specifically, a frame-shaped film of adhesive 16, for application about the pads 15 on the semiconductor element 14 in this embodiment, is provided as shown in the plan view of FIG. 1(d) and the side view of FIG. 1(d)'.

Figure 2A:
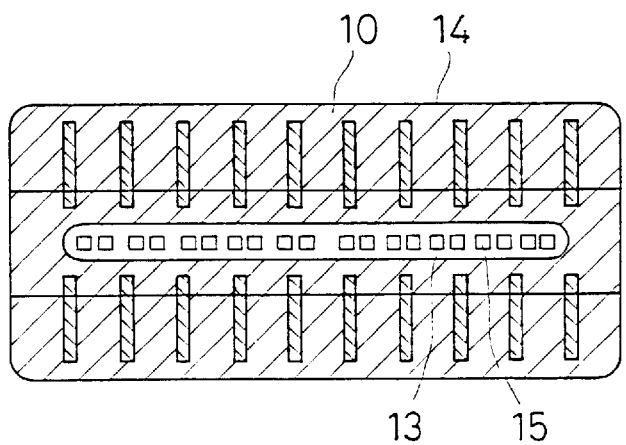
FIGS. 2(a) to 2(d)' illustrate a second part of the procedure for producing the semiconductor device of the first embodiment.
Figure 2A:
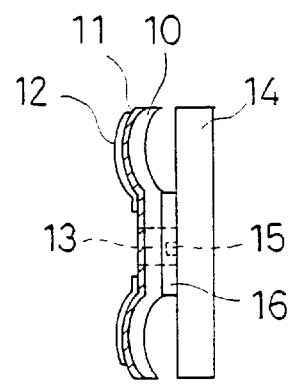

(5) The circuit strip 10 and the semiconductor element 14 are fixedly joined to each other by the adhesive 16 as shown in the plan view of FIG. 2(a) and the side view of FIG. 2(a)', where the pads 15 on the semiconductor element 14 are exposed across the through opening 13.

Figure 2B:
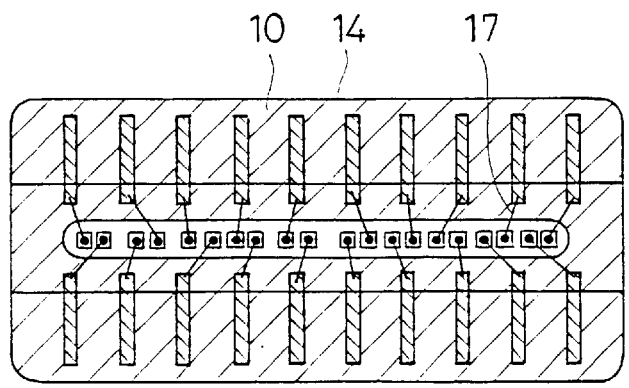
Figure 2B:
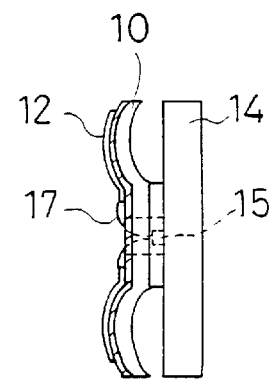

(6) The pads 15 are respectively electrically connected by wires 17 to the corresponding patterns 12 on the circuit strip 10, as shown in the plan view of FIG. 2(b) and the side view of FIG. 2(b)'.

Figure 2C:
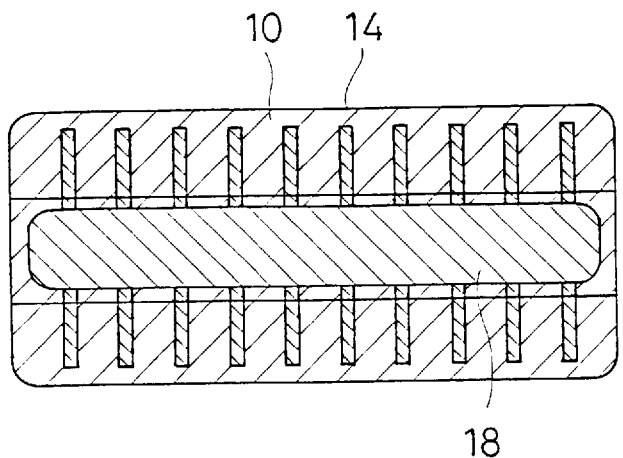
Figure 2C:
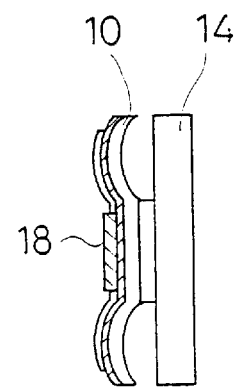

(7) A limited region about the through opening 13 of the circuit strip 10 is coated with a resin material 18 to complete a semiconductor device, as shown in the plan view of FIG. 2(c) and the side view of FIG. 2(c)'. As a result, the wires 17 connecting the pads 15 and the patterns 12 on the circuit strip 10 are completely sealed by the resin material 18.

Figure 2D:
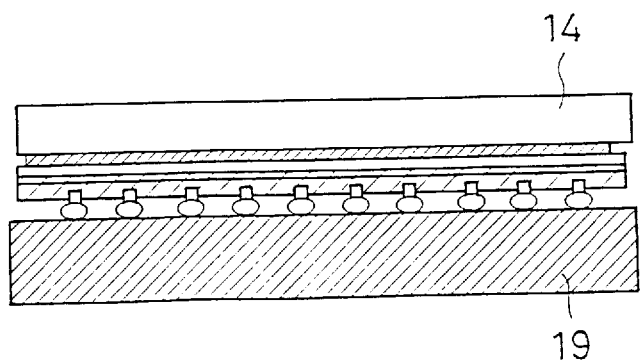
Figure 2D:
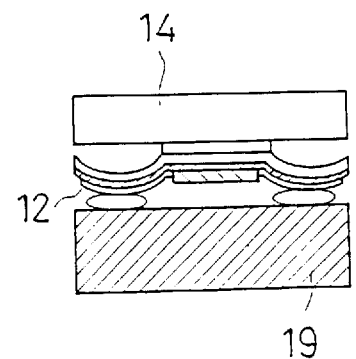

(8) The finished semiconductor device is then mounted to a circuit board 19 as in the plan view of FIG. 2(d) and the side view of FIG. 2(d)'. More specifically, the patterns 12 on the circuit strip 10 are bonded, e.g. by soldering, to corresponding patterns(not shown) provided on the upper side of the circuit board 19 so that the semiconductor device is securely mounted.

As understood, the conventional steps of securing to the surface of a semiconductor element a lead frame which has been elaborated to a particular shape by a high-cost method such as etching, connecting with wires, covering all except specific exposed regions of the assembly with a resin material, and forming external electrodes on the exposed regions of the lead frame, are replaced by a procedure of the first embodiment of the invention which includes bending a circuit strip made of metal, bonding a semiconductor element to the circuit strip, and after connection with wires, covering a limited region with resin to seal the wires. This allows the semiconductor device to be simple in construction. Also, the patterns can be formed on the circuit strip by a known printed circuit board technology and their dimensional accuracy will thus be improved, thereby contributing to the realization of higher density mounting.

Second Embodiment

A procedure for producing the semiconductor device of a second embodiment of the present invention will be described referring to FIGS. 3(a) to 3(d)'.

Figure 3A:
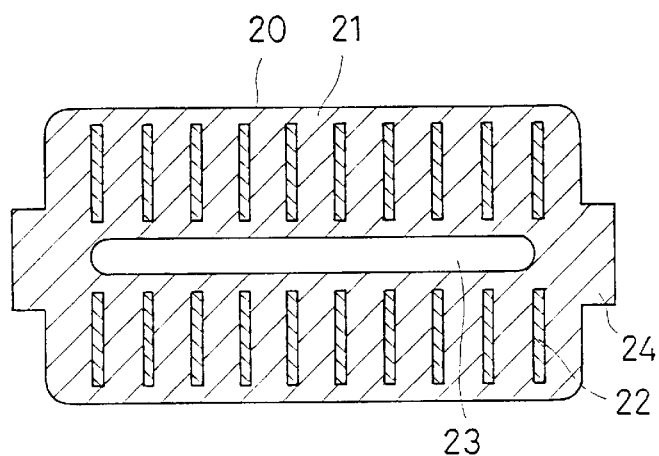
FIGS. 3(a) to 3(d)' show a procedure for producing a semiconductor device of a second embodiment according to the present invention.
Figure 3A:
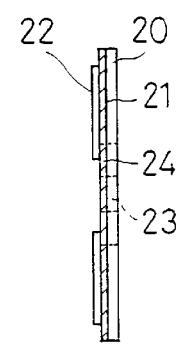

(1) The procedure starts with preparing a circuit strip 20, made of e.g. a metal, which has an insulating layer 21 and an array of patterns 22 formed on one side thereof, as best shown in the plan view of FIG. 3(a) and the side view of FIG. 3(a)'. The circuit strip 20 has a through opening 23 provided in a center region thereof, similarly to that of the first embodiment. In addition, the circuit strip 20 of the second embodiment has ribs 24 provided at both lengthwise ends thereof.

Figure 3B:
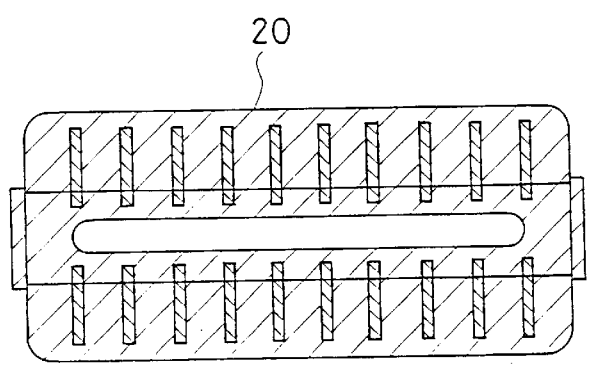
Figure 3B:
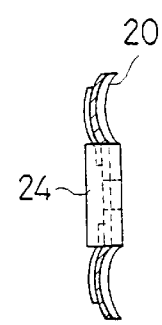

(2) The circuit strip 20, like in the first embodiment, is tailored by pressing or other means to have the patterns 22 arcuately projected, as shown in the plan view of FIG. 3(b) and the side view of FIG. 3(b)'. Simultaneously, the ribs 24 of the second embodiment are bent in the same direction.

Figure 3C:
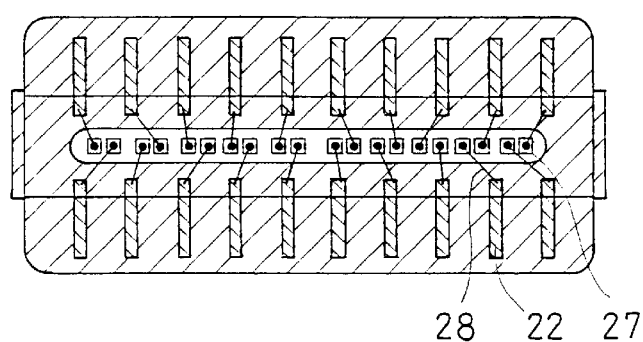
Figure 3C:
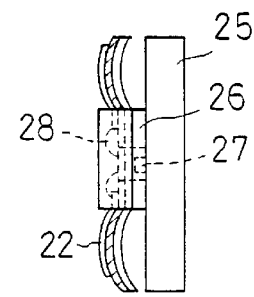

(3) Like in the first embodiment, a semiconductor element 25 is bonded by a film of adhesive 26 to the circuit strip 20, as shown in the plan view of FIG. 3(c) and the side view of FIG. 3(c)'. Then, patterns 22 on the circuit strip 20 are electrically connected by wires 28 to bonding pads 27 provided on the semiconductor element 25 and exposed across the through opening 23.

Figure 3D:
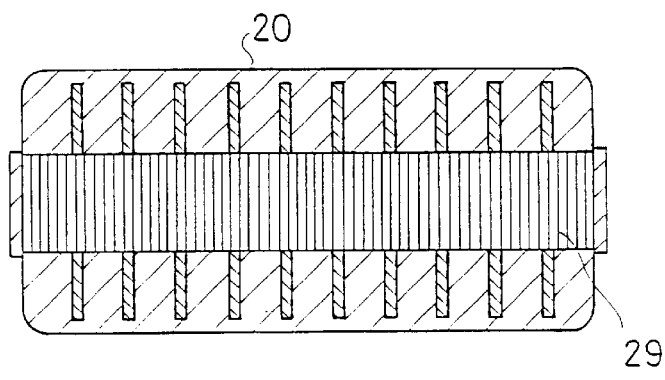
Figure 3D:
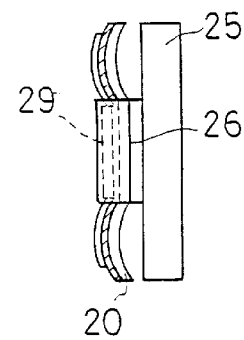

(4) When the circuit strip 20 is partially sealed with a fluid of resin material 29, the semiconductor device is completed as shown in the plan view of FIG. 3(d) and the side view of FIG. 3(d)'.

The ribs 24 in the second embodiment serve as barriers(or dams) to prevent overflow of the resin material 29 during the sealing.

The second embodiment, in which the ribs are provided for preventing the resin material from overflowing to the circuit strip, is more advantageous than the first embodiment in facilitating the procedure with the use of a fluid resin material. Also, the bonded region is reinforced by the ribs to prevent deflection and will thus be enhanced in physical strength.

Third Embodiment

A procedure for producing the semiconductor device of a third embodiment of the present invention will be described referring to FIGS. 4(a) to 4(b)' and 5(a) to 5(c)'.

Figure 4A:
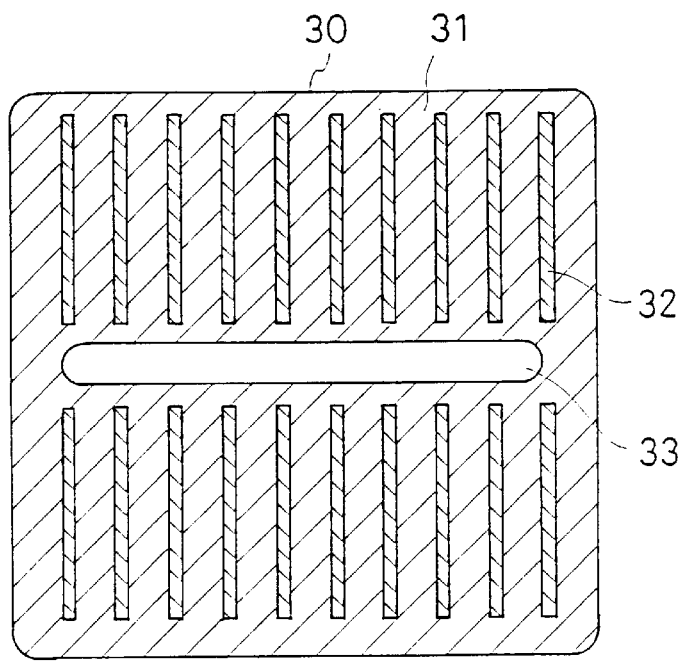
FIGS. 4(a) to 4(b)' illustrate a first part of a procedure for producing a semiconductor device of a third embodiment according to the present invention.
Figure 4A:
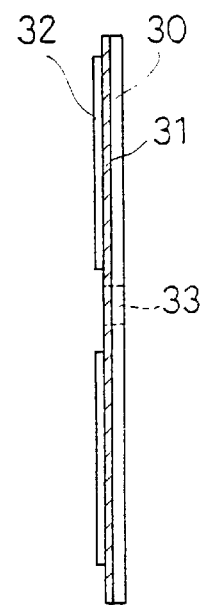

(1) The procedure starts with preparing a circuit strip 30, made of e.g. a metal, with an insulating layer 31 and an array of patterns 32 formed on one side thereof and a through opening 33 therein, as best shown in the plan view of FIG. 4(a) and the side view of FIG. 4(a)'.

Figure 4B:
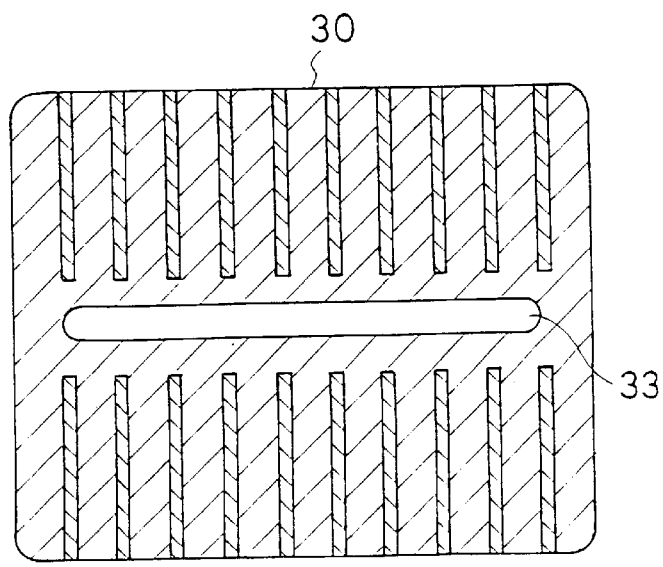
Figure 4B:
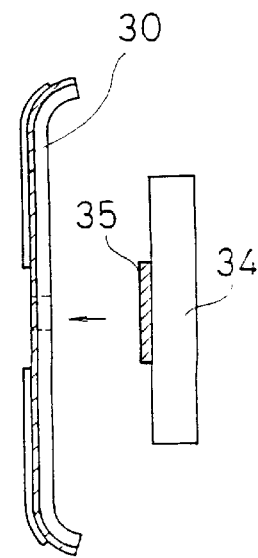

(2) The circuit strip 30, like in the first embodiment, is bent to an arcuate shape(J bend) by pressing or other means, and then, bonded by adhesive 35 to a semiconductor element 34, as shown in the plan view of FIG. 4(b) and the side view of FIG. 4(b)'.

(3) Like in the first embodiment, bonding pads 36 provided on the semiconductor element 34 and exposed across the through opening 33, are electrically connected by wires 37 to corresponding patterns 32 of the circuit strip 30, as shown in the plan view of FIG. 5(a) and the side view of FIG. 5(a)'.

Figure 5B:
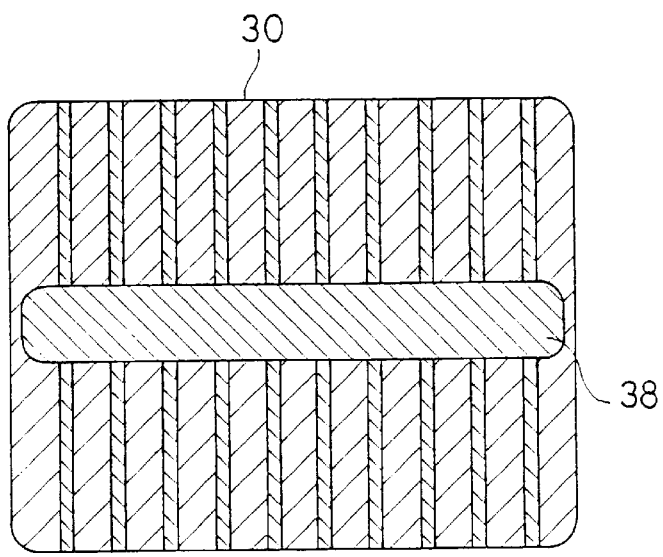
Figure 5B:
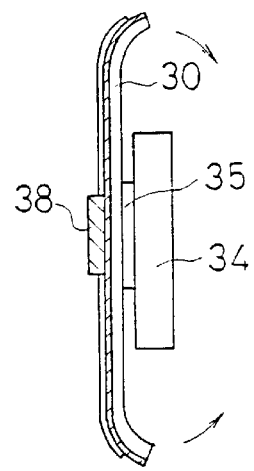

(4) A limited region about the through opening 33 of the circuit strip 30 is coated with a resin material 38 to seal the wires 37, like in the first embodiment, and both side ends of the circuit strip 30 are bent, as shown the plan view of FIG. 5(b) and the side view of FIG. 5(b),' by pressing or other means, so that they wrap around the semiconductor element 34.

Figure 5C:
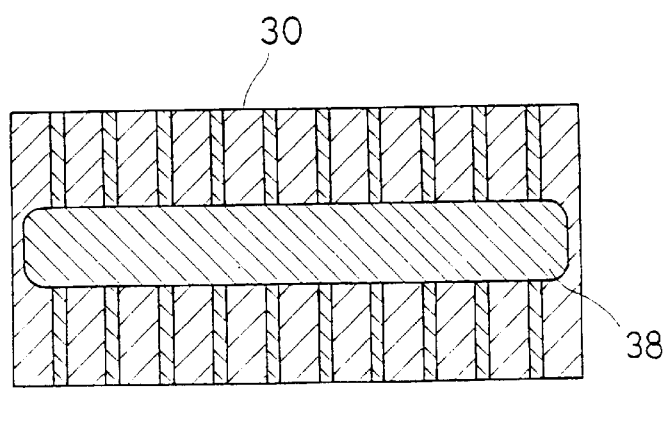
Figure 5C:
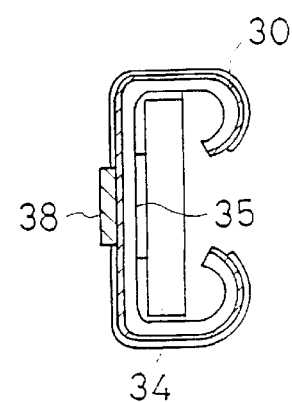

(5) As a result, the semiconductor device having a J-bend configuration is completed as shown in the plan view of FIG. 5(c) and the side view of FIG. 5(c)'.

Since the semiconductor element 34 is wrapped in the circuit strip 30, the semiconductor device of the third embodiment is increased in mechanical strength while mounted on an unshown circuit board. The semiconductor device of the third embodiment, in which the semiconductor element is wrapped in a metal circuit strip, is also enhanced by the shielding effect of the strip to provide improved electrical characteristics as well as in increased mechanical strength, for providing a higher level of the reliability while mounted on the circuit board.

Fourth Embodiment

A procedure for producing the semiconductor device of a fourth embodiment of the present invention will be described referring to FIGS. 6(a), 6(a)', and 6(b).

Figure 6A:
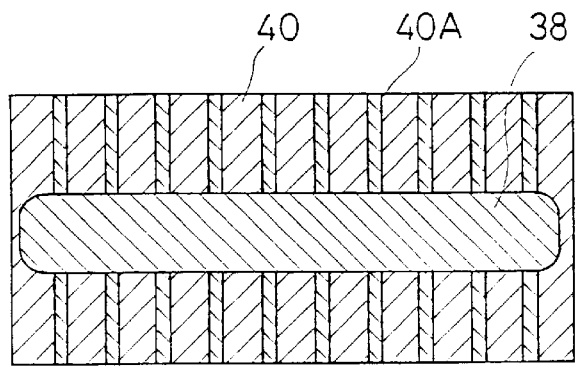
FIGS. 6(a) to 6(b) show a procedure for mounting on a circuit board a semiconductor device of a fourth embodiment according to the present invention.
Figure 6A:
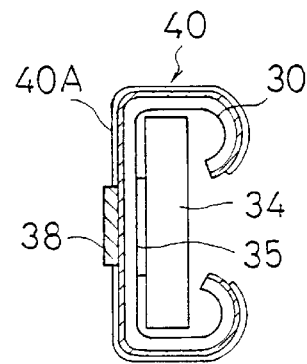

(1) The procedure starts with producing a semiconductor device 40 in the same manner as in of the third embodiment, as best shown in the plan view of FIG. 6(a) and the side view of FIG. 6(a)'. Its patterns are denoted by reference character 40A.

Figure 6B:
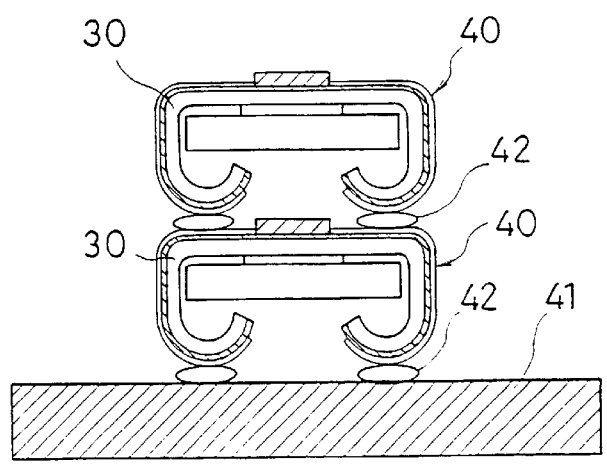

(2) The semiconductor device 40 is securely mounted to a circuit board 41 by bonding means such as solder paste 42, as shown in FIG. 6(b). Another semiconductor device 40 produced in the same manner, is mounted on the first semiconductor device 40, by such bonding means as the solder paste 42. If necessary, one or more identical semiconductor devices may be mounted one over the other to provide a tower of the semiconductor devices.

The semiconductor devices 40 of the fourth embodiment are joined to each other by soldering the patterns 40A provided on the circuit strips 30 coupled to the semiconductor elements 34, in the same manner that the patterns of the first device are soldered to mount the first device on the circuit board 41.

The fourth embodiment allows the semiconductor devices to be increased in number or in their processing capability in a limited space of the circuit board. This will provide the same effect as of the stack mounting of conventional dual inline packaged semiconductor devices. The structure of the semiconductor device of this embodiment is thus more advantageous than the prescribed CSP structure of conventional semiconductor devices.

Fifth Embodiment

Figure 7A:
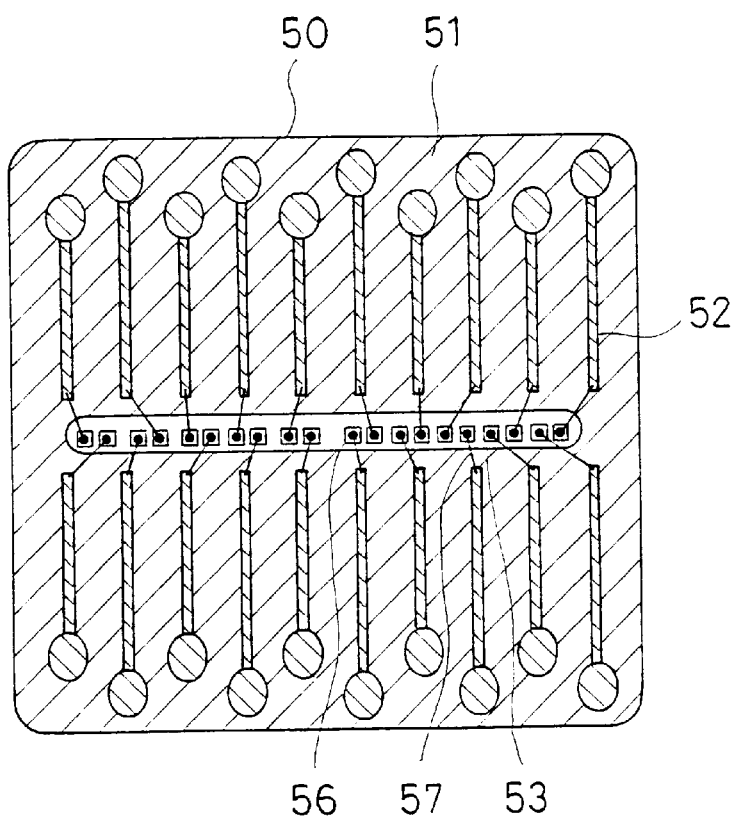
FIGS. 7(a) to 7(c)' illustrate a procedure for producing a semiconductor device of a fifth embodiment according to the present invention.
Figure 7A:
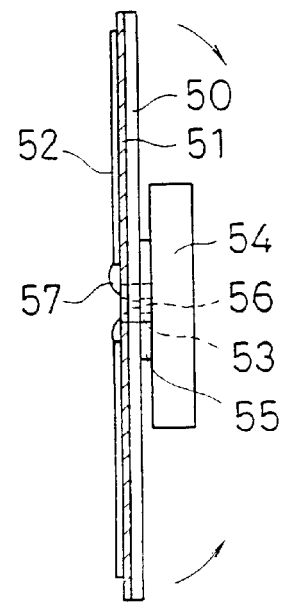
Figure 7B:
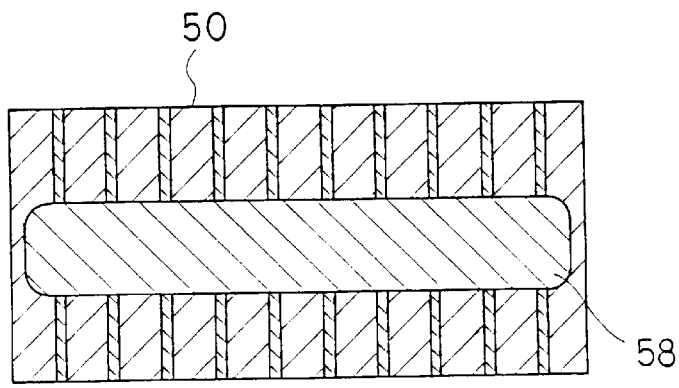
Figure 7B:
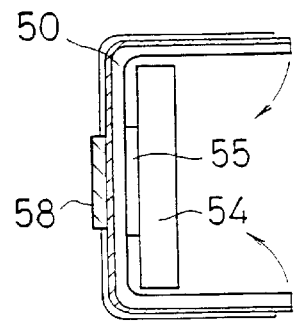
Figure 7C:
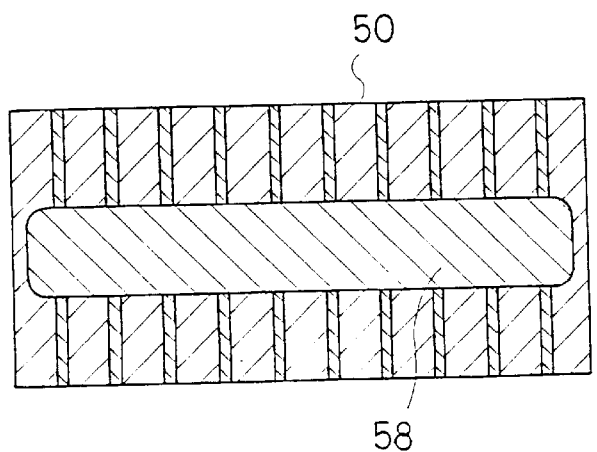
Figure 7C:
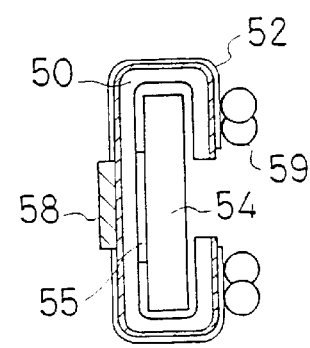
Figure 8:
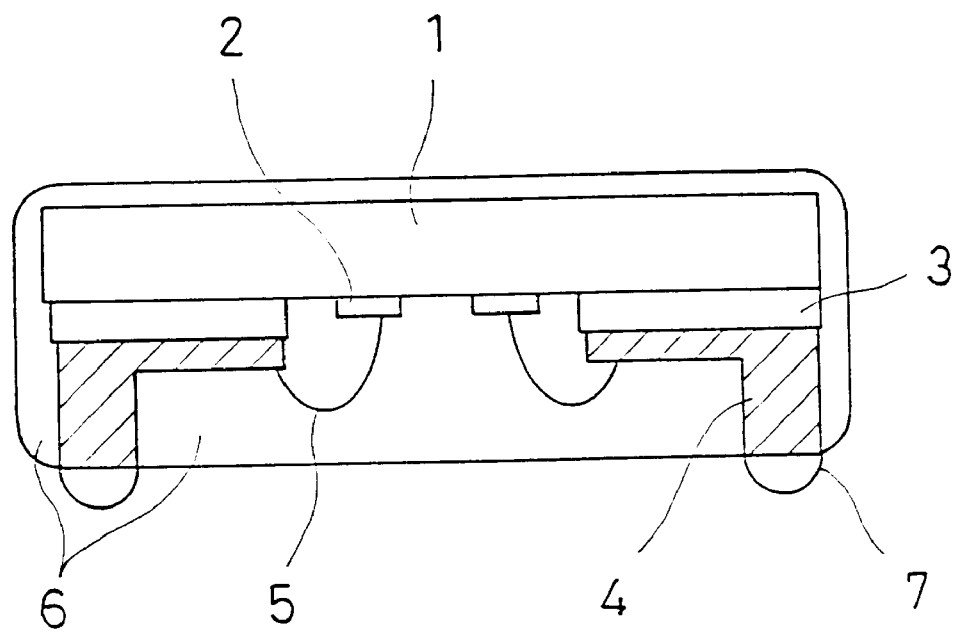
FIG. 8 is a cross-sectional view of a conventional chip scale package.

FIGS. 7(a) to 7(c)' illustrate a procedure for producing the semiconductor device of a fifth embodiment of the present invention.

(1) The procedure starts with preparing a circuit strip 50, made of e.g. a metal, which has an insulating layer 51 and an array of patterns 52 formed on one side thereof and a through opening 53 therein, and coupled by adhesive 55 to a semiconductor element 54, as shown in the plan view of FIG. 7(a) and the side view of FIG. 7(a)'. The patterns 52 of the circuit strip 50 are electrically connected by wires 57 to corresponding bonding pads 56 provided on the semiconductor element 54 and exposed across the through opening 53.

(2) Like in the first embodiment, a limited region about the through opening 53 of the circuit strip 50 is coated with a resin material 58 to seal the wires 57. Then, both side ends of the circuit strip 50 are bent(to L shapes), as shown the plan view of FIG. 7(b) and the side view of FIG. 7(b), by pressing or other means, like the third embodiment, so that they wrap around the semiconductor element 54'.

(3) After electrodes 59, of e.g. solder paste balls, are formed on the patterns 52, the semiconductor device is completed as shown in the plan view of FIG. 7(c) and the side view of FIG. 7(c)'.

The electrodes(of solder paste balls) 59 of the fifth embodiment are used for mounting the device on an unshown circuit board, thereby allowing the semiconductor device to be compatible with reflow conditions required for mounting known ball grid array semiconductor devices which have been widely employed as multi-pin logic devices.

The semiconductor device of the fifth embodiment is thus matched to the reflow conditions required for mounting to a circuit board and permits the patterns of its circuit strip to be used for examining the electric characteristics after completion(i.e. after the solder paste balls have been joined), thereby preventing the solder paste balls from being damaged(e.g. deformed by pressing a probe). Also, the patterns are used for inspecting the bonding condition or conduction of the lower side(the solder paste balls) of the semiconductor device to the circuit board which may hardly be viewed, whereby a higher level of mounting will be ensured.

As a result, the semiconductor devices of surface-mount type according to the first, second, third, and fifth embodiments of the present invention can be mounted on any circuit board(not shown) with much ease.

Although the present invention is described in relation to the preferred embodiments of a semiconductor and a method of producing the same, it is not limited to the embodiments. It is understood by those skilled in the art that various changes and modifications are made without departing from the teachings and technical features of the present invention defined in the appended claims as fall within the scope of the present invention.

As set forth above, the present invention provides a novel, improved semiconductor device of surface-mount type which is simple in structure and intended for high-density mounting, an appliance on which the semiconductor device is mounted, and a method of producing the semiconductor device.

The entire disclosure of Japanese Patent Application No. 9-27424 filed on Feb. 12, 1997 including specification, claims, drawings, and summary is incorporated herein by reference in its entirety.

What is claimed is:

1. A semiconductor device, comprising:
a metal circuit strip having a through hole formed therein;
an insulating layer disposed on the metal circuit strip and having a through hole disposed in registration with the through hole of said circuit strip;
a plurality of separated projecting patterns formed on the insulating layer and disposed in an array about a periphery of the through hole of said insulating layer;
a semiconductor element disposed below said circuit strip and fixedly joined to the circuit strip, so that the insulating layer is sandwiched between the projecting patterns and the metal circuit strip, and the metal circuit strip is sandwiched between the insulating layer and the semiconductor element;

a plurality of pads on the semiconductor element, said pads being in registration with the through hole of said circuit strip and the through hole of said insulating layer so as to be accessible through the respective through holes;

a plurality of wires, each wire being electrically connected between a respective pad and a respective corresponding projecting pattern on the circuit strip; and a resin material sealing the wires, whereby said projecting patterns project outward beyond an outer surface of said insulating layer so as to provide an exposed surface that is electrically couplable to a circuit board.

2. A semiconductor device according to claim 1, wherein the circuit strip has a through opening in a region thereof where the pads on the semiconductor element are exposed for joining with the wires.

3. A semiconductor device according to claim 1, wherein the circuit strip has a rib provided at each respective longitudinal end thereof.

4. A semiconductor device according to claim 1, wherein the semiconductor element is wrapped with both side ends of the circuit strip.

5. A semiconductor device according to claim 4, wherein the semiconductor element is wrapped with both side ends of the circuit strip and electrodes are formed on the projecting patterns.

6. A semiconductor device mounted appliance, comprising a circuit board and a plurality of the semiconductor devices defined in claim 5, the devices mounted, one over another on the circuit board, adjacent ones of the devices being joined together at their respective projecting patterns.

7. The semiconductor device of claim 1, wherein said metal circuit strip, and said insulating layer are disposed on only one side of said semiconductor element.

8. The semiconductor device of claim 1, wherein the through holes are disposed over the semiconductor element.

9. A semiconductor device mounted appliance, comprising a circuit board and at least one semiconductor device mounted on the circuit board, the semiconductor device including:

a metal circuit strip having a through hole formed therein;

an insulating layer disposed on the metal circuit strip and having a through hole disposed in registration with the through hole of said circuit strip;

a plurality of projecting patterns formed on the insulating layer and disposed in an array about a periphery of the through hole of said insulating layer;

a semiconductor element disposed below said circuit strip and fixedly joined to the circuit strip, so that the insulating layer is sandwiched between the projecting patterns and the metal circuit strip, and the metal circuit strip is sandwiched between the insulating layer and the semiconductor element;

a plurality of pads on the semiconductor element, said pads being in registration with the through hole of said circuit strip and the through hole of said insulating layer so as to be accessible through the respective through holes;

a plurality of wires, each wire being electrically connected between a respective pad and a respective corresponding projecting pattern on the circuit strip; and a resin material sealing the wires, whereby said projecting patterns project outward beyond an outer surface of said insulating layer so as to provide an exposed surface that is electrically couplable to a circuit board.

10. A semiconductor device mounted appliance according to claim 9, wherein the circuit strip has a through opening in a region thereof where the pads on the semiconductor element are exposed for joining with the wires.

11. A semiconductor device mounted appliance according to claim 9, wherein the circuit strip is provided with a rib at each respective longitudinal end thereof.

12. A semiconductor device mounted appliance according to claim 9, wherein the semiconductor element is wrapped with both side ends of the circuit strip.

13. A semiconductor device mounted appliance according to claim 9, wherein the semiconductor element is wrapped with side ends of the circuit strip and electrodes are formed on the projecting patterns.

14. A semiconductor device, comprising:

a semiconductor element having a plurality of pads on one side thereof;

a circuit strip having a through hole formed therein, and having a plurality of conductive patterns disposed around the through hole and being exposed on one side of said circuit strip, the other side of said circuit strip being bonded to the semiconductor element, each respective conductive pattern corresponding to a respective one of the pads;

a plurality of wires, each electrically joining a respective pad to a corresponding conductive pattern by way of the through hole; and a sealing material sealing the pads and the wires;

wherein the circuit strip extends over opposite side ends and a rear side of the semiconductor element, while each of its conductive patterns extends from a pad connecting region of the circuit strip to the rear side of the semiconductor element.

15. A semiconductor device according to claim 14, wherein each conductive pattern extends between a projected region in which the conductive patterns project outward, and a pad connecting region of the circuit strip, in which the respective conductive patterns are connected to respective pads.

16. A semiconductor device, comprising:

a semiconductor element having a plurality of pads on a surface of the element;

a metal circuit strip having one side fixed on the surface of the element;

an insulating layer disposed on an opposing side of the circuit strip;

an array of conductive patterns formed on the insulating layer so that the insulating layer is sandwiched between the circuit strip and the array of conductive patterns, and the circuit strip is disposed between the insulating layer and the semiconductor element;

wherein the array of conductive patterns corresponds to the pads and are connected to the pads; and a sealing material completely coating the pads and only a portion of the conductive patterns, a further portion of the conductive patterns being free of the sealing material for connection with a circuit board.

17. A semiconductor device, comprising:

a metal circuit strip having a through hole, and having a substantially arcuate shape;

an insulating layer formed on the metal circuit strip;

an array of projecting conductive patterns formed on the insulating layer;

a semiconductor element having a plurality of pads, and being fixed to the circuit strip, so that the pads are exposed in the through hole;

wires electrically connected between said pads and said corresponding conductive patterns; and a resin material sealing the wires.

18. The semiconductor device according to claim 17, wherein said pads are formed on a center region of a top surface of the semiconductor element.

19. The semiconductor device according to claim 17, wherein said metal circuit strip is fixed to the top surface of the semiconductor element using an adhesive.

20. A semiconductor device, comprising:

a semiconductor element having a plurality of pads, said pads being disposed at a center region of a top surface of said semiconductor element;

a metal plate having a substantially arcuate shape, and having a through hole, said metal plate being fixed to the top surface of said semiconductor element, so that said pads are exposed at the through hole;

an insulating layer formed on the metal plate;

a plurality of projecting conductive patterns formed on the insulating layer, said conductive patterns being electrically connected to the pads via the through hole; and a resin material sealing the pads.

21. The semiconductor device of claim 20, wherein said metal plate, and said insulating layer are disposed on only one side of said semiconductor element.

22. The semiconductor device of claim 20, wherein the through hole is disposed over the semiconductor element.

23. The semiconductor device according to claim 20, wherein said pads are formed on a center region of a top surface of the semiconductor element.

24. The semiconductor device according to claim 20, wherein said metal plate is fixed to the top surface of the semiconductor element using an adhesive.

25. A semiconductor device, comprising:

a prefabricated circuit strip which includes a metal plate having a substantially arcuate shape, and having a through hole, an insulating layer formed on the metal plate, and a plurality of projecting conductive patterns formed on the insulating layer;

a semiconductor element having a plurality of pads, said semiconductor element being fixed to the circuit strip, so that said pads are disposed at the through hole and said pads are electrically connected to the conductive patterns; and a resin material sealing the pads.

26. The semiconductor device of claim 25, wherein said metal plate, and said insulating layer are disposed on only one side of said semiconductor element.

27. The semiconductor device of claim 25, wherein the through hole is disposed over the semiconductor element.

28. The semiconductor device according to claim 25, wherein said pads are formed on a center region of a top surface of the semiconductor element.

29. The semiconductor device according to claim 25, wherein said metal plate is fixed to the top surface of the semiconductor element using an adhesive.

* * * * *